United States Patent
Ji et al.

(10) Patent No.: US 7,814,400 B2
(45) Date of Patent: Oct. 12, 2010

(54) DIGITAL BROADCASTING TRANSMISSION APPARATUS AND INSERTING METHOD OF INFORMATION FOR RECEIVER DEMODULATION THEREOF

(75) Inventors: Kum-ran Ji, Seoul (KR); Yong-sik Kwon, Seoul (KR); Joon-soo Kim, Seoul (KR); Jung-pil Yu, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 1050 days.

(21) Appl. No.: 11/527,680

(22) Filed: Sep. 27, 2006

(65) Prior Publication Data
US 2007/0245207 A1    Oct. 18, 2007

Related U.S. Application Data

(60) Provisional application No. 60/788,729, filed on Apr. 4, 2006.

(30) Foreign Application Priority Data
Jun. 29, 2006    (KR) .................. 10-2006-0059505

(51) Int. Cl.
*H03M 13/03* (2006.01)
(52) U.S. Cl. .................................................. 714/792
(58) Field of Classification Search ............ 714/792, 714/786; 375/240.01, 301, 265
See application file for complete search history.

(56) References Cited

U.S. PATENT DOCUMENTS

| | | | |
|---|---|---|---|
| 7,092,455 B2 * | 8/2006 | Choi et al. | 375/301 |
| 2006/0285608 A1 | 12/2006 | Kim et al. | |
| 2007/0014378 A1 | 1/2007 | Parhi et al. | |
| 2008/0273589 A1 * | 11/2008 | Kim et al. | 375/240.01 |

FOREIGN PATENT DOCUMENTS

| | | |
|---|---|---|
| WO | WO 2004/062283 | 7/2004 |
| WO | WO 2006/126805 A1 * | 11/2006 |

OTHER PUBLICATIONS

Search Report issued on Jul. 16, 2007 by the International Searching Authority for International Application No. PCT/KR2007/001567.

* cited by examiner

*Primary Examiner*—Shelly A Chase
(74) *Attorney, Agent, or Firm*—Sughrue Mion, PLLC (57) ABSTRACT

A digital broadcasting transmission apparatus and an inserting method of information for receiver demodulation thereof. The digital broadcasting transmission apparatus includes: a turbo coder performing turbo coding on a transport stream (TS) a field sync signal generator inserting information for receiver demodulation into a reserved area of a field sync signal; and a multiplexer adding the field sync signal into which the information for receiver demodulation has been inserted and a segment sync signal to the turbo coded TS to form a data frame. Accordingly, a reception apparatus can precisely determine the information for receiver demodulation and thus provides an improved reception performance.

10 Claims, 13 Drawing Sheets

|    | 0 | 1 | 2 | 3 | 4 | 5 | 6 | 7 | 8 | 9 | 10 | 11 | 12 | 13 | 14 | 15 |
|----|---|---|---|---|---|---|---|---|---|---|----|----|----|----|----|----|
| 0  | 0 | 0 | 0 | 0 | 0 | 0 | 0 | 0 | 0 | 0 | 0  | 0  | 0  | 0  | 0  | 0  |
| 1  | 0 | 1 | 0 | 1 | 0 | 1 | 0 | 1 | 0 | 1 | 0  | 1  | 0  | 1  | 0  | 1  |
| 2  | 0 | 0 | 1 | 1 | 0 | 0 | 1 | 1 | 0 | 0 | 1  | 1  | 0  | 0  | 1  | 1  |
| 3  | 0 | 1 | 1 | 0 | 0 | 1 | 1 | 0 | 0 | 1 | 1  | 0  | 0  | 1  | 1  | 0  |
| 4  | 0 | 0 | 0 | 0 | 1 | 1 | 1 | 1 | 0 | 0 | 0  | 0  | 1  | 1  | 1  | 1  |
| 5  | 0 | 1 | 0 | 1 | 1 | 0 | 1 | 0 | 0 | 1 | 0  | 1  | 1  | 0  | 1  | 0  |
| 6  | 0 | 0 | 1 | 1 | 1 | 1 | 0 | 0 | 0 | 0 | 1  | 1  | 1  | 1  | 0  | 0  |
| 7  | 0 | 1 | 1 | 0 | 1 | 0 | 0 | 1 | 0 | 1 | 1  | 0  | 1  | 0  | 0  | 1  |
| 8  | 0 | 0 | 0 | 0 | 0 | 0 | 0 | 0 | 1 | 1 | 1  | 1  | 1  | 1  | 1  | 1  |
| 9  | 0 | 1 | 0 | 1 | 0 | 1 | 0 | 1 | 1 | 0 | 1  | 0  | 1  | 0  | 1  | 0  |
| 10 | 0 | 0 | 1 | 1 | 0 | 0 | 1 | 1 | 1 | 1 | 0  | 0  | 1  | 1  | 0  | 0  |
| 11 | 0 | 1 | 1 | 0 | 0 | 1 | 1 | 0 | 1 | 0 | 0  | 1  | 1  | 0  | 0  | 1  |
| 12 | 0 | 0 | 0 | 0 | 1 | 1 | 1 | 1 | 1 | 1 | 1  | 1  | 0  | 0  | 0  | 0  |
| 13 | 0 | 1 | 0 | 1 | 1 | 0 | 1 | 0 | 1 | 0 | 1  | 0  | 0  | 1  | 0  | 1  |
| 14 | 0 | 0 | 1 | 1 | 1 | 1 | 0 | 0 | 1 | 1 | 0  | 0  | 0  | 0  | 1  | 1  |
| 15 | 0 | 1 | 1 | 0 | 1 | 0 | 0 | 1 | 1 | 0 | 0  | 1  | 0  | 1  | 1  | 0  |

FIG. 6B

|    | 0 | 1 | 2 | 3 | 4 | 5 | 6 | 7 | 8 | 9 | 10 | 11 | 12 | 13 | 14 | 15 |
|----|---|---|---|---|---|---|---|---|---|---|----|----|----|----|----|----|
| 0  | 1 | 1 | 1 | 1 | 1 | 1 | 1 | 1 | 1 | 1 | 1  | 1  | 1  | 1  | 1  | 1  |
| 1  | 1 | 0 | 1 | 0 | 1 | 0 | 1 | 0 | 1 | 0 | 1  | 0  | 1  | 0  | 1  | 0  |
| 2  | 1 | 1 | 0 | 0 | 1 | 1 | 0 | 0 | 1 | 1 | 0  | 0  | 1  | 1  | 0  | 0  |
| 3  | 1 | 0 | 0 | 1 | 1 | 0 | 0 | 1 | 1 | 0 | 0  | 1  | 1  | 0  | 0  | 1  |
| 4  | 1 | 1 | 1 | 1 | 0 | 0 | 0 | 0 | 1 | 1 | 1  | 1  | 0  | 0  | 0  | 0  |
| 5  | 1 | 0 | 1 | 0 | 0 | 1 | 0 | 1 | 1 | 0 | 1  | 0  | 0  | 1  | 0  | 1  |
| 6  | 1 | 1 | 0 | 0 | 0 | 0 | 1 | 1 | 1 | 1 | 0  | 0  | 0  | 0  | 1  | 1  |
| 7  | 1 | 0 | 0 | 1 | 0 | 1 | 1 | 0 | 1 | 0 | 0  | 1  | 0  | 1  | 1  | 0  |
| 8  | 1 | 1 | 1 | 1 | 1 | 1 | 1 | 1 | 0 | 0 | 0  | 0  | 0  | 0  | 0  | 0  |
| 9  | 1 | 0 | 1 | 0 | 1 | 0 | 1 | 0 | 0 | 1 | 0  | 1  | 0  | 1  | 0  | 1  |
| 10 | 1 | 1 | 0 | 0 | 1 | 1 | 0 | 0 | 0 | 0 | 1  | 1  | 0  | 0  | 1  | 1  |
| 11 | 1 | 0 | 0 | 1 | 1 | 0 | 0 | 1 | 0 | 1 | 1  | 0  | 0  | 1  | 1  | 0  |
| 12 | 1 | 1 | 1 | 1 | 0 | 0 | 0 | 0 | 0 | 0 | 0  | 0  | 1  | 1  | 1  | 1  |
| 13 | 1 | 0 | 1 | 0 | 0 | 1 | 0 | 1 | 0 | 1 | 0  | 1  | 1  | 0  | 1  | 0  |
| 14 | 1 | 1 | 0 | 0 | 0 | 0 | 1 | 1 | 0 | 0 | 1  | 1  | 1  | 1  | 0  | 0  |
| 15 | 1 | 0 | 0 | 1 | 0 | 1 | 1 | 0 | 0 | 1 | 1  | 0  | 1  | 0  | 0  | 1  |

FIG. 7A

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 | 0 |
| 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 |
| 2 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 |
| 3 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 |
| 4 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 |
| 5 | 0 | 1 | 0 | 1 | 1 | 0 | 1 | 0 | 0 | 1 | 0 | 1 | 1 | 0 | 1 | 0 | 0 | 1 | 0 | 1 | 1 | 0 | 1 | 0 | 0 | 1 | 0 | 1 | 1 | 0 | 1 | 0 |
| 6 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 |
| 7 | 0 | 1 | 1 | 0 | 1 | 0 | 0 | 1 | 0 | 1 | 1 | 0 | 1 | 0 | 0 | 1 | 0 | 1 | 1 | 0 | 1 | 0 | 0 | 1 | 0 | 1 | 1 | 0 | 1 | 0 | 0 | 1 |
| 8 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 |
| 9 | 0 | 1 | 0 | 1 | 0 | 1 | 0 | 1 | 1 | 0 | 1 | 0 | 1 | 0 | 1 | 0 | 0 | 1 | 0 | 1 | 0 | 1 | 0 | 1 | 1 | 0 | 1 | 0 | 1 | 0 | 1 | 0 |
| 10 | 0 | 0 | 1 | 1 | 0 | 0 | 1 | 1 | 1 | 1 | 0 | 0 | 1 | 1 | 0 | 0 | 0 | 0 | 1 | 1 | 0 | 0 | 1 | 1 | 1 | 1 | 0 | 0 | 1 | 1 | 0 | 0 |
| 11 | 0 | 1 | 1 | 0 | 0 | 1 | 1 | 0 | 1 | 0 | 0 | 1 | 1 | 0 | 0 | 1 | 0 | 1 | 1 | 0 | 0 | 1 | 1 | 0 | 1 | 0 | 0 | 1 | 1 | 0 | 0 | 1 |
| 12 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 0 | 0 | 0 | 0 |
| 13 | 0 | 1 | 0 | 1 | 1 | 0 | 1 | 0 | 1 | 0 | 1 | 0 | 0 | 1 | 0 | 1 | 0 | 1 | 0 | 1 | 1 | 0 | 1 | 0 | 1 | 0 | 1 | 0 | 0 | 1 | 0 | 1 |
| 14 | 0 | 0 | 1 | 1 | 1 | 1 | 0 | 0 | 1 | 1 | 0 | 0 | 0 | 0 | 1 | 1 | 0 | 0 | 1 | 1 | 1 | 1 | 0 | 0 | 1 | 1 | 0 | 0 | 0 | 0 | 1 | 1 |
| 15 | 0 | 1 | 1 | 0 | 1 | 0 | 0 | 1 | 1 | 0 | 0 | 1 | 0 | 1 | 1 | 0 | 0 | 1 | 1 | 0 | 1 | 0 | 0 | 1 | 1 | 0 | 0 | 1 | 0 | 1 | 1 | 0 |
| 16 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 |
| 17 | 0 | 1 | 0 | 1 | 0 | 1 | 0 | 1 | 0 | 1 | 0 | 1 | 0 | 1 | 0 | 1 | 1 | 0 | 1 | 0 | 1 | 0 | 1 | 0 | 1 | 0 | 1 | 0 | 1 | 0 | 1 | 0 |
| 18 | 0 | 0 | 1 | 1 | 0 | 0 | 1 | 1 | 0 | 0 | 1 | 1 | 0 | 0 | 1 | 1 | 1 | 1 | 0 | 0 | 1 | 1 | 0 | 0 | 1 | 1 | 0 | 0 | 1 | 1 | 0 | 0 |
| 19 | 0 | 1 | 1 | 0 | 0 | 1 | 1 | 0 | 0 | 1 | 1 | 0 | 0 | 1 | 1 | 0 | 1 | 0 | 0 | 1 | 1 | 0 | 0 | 1 | 1 | 0 | 0 | 1 | 1 | 0 | 0 | 1 |
| 20 | 0 | 0 | 0 | 0 | 1 | 1 | 1 | 1 | 0 | 0 | 0 | 0 | 1 | 1 | 1 | 1 | 1 | 1 | 1 | 1 | 0 | 0 | 0 | 0 | 1 | 1 | 1 | 1 | 0 | 0 | 0 | 0 |
| 21 | 0 | 1 | 0 | 1 | 1 | 0 | 1 | 0 | 0 | 1 | 0 | 1 | 1 | 0 | 1 | 0 | 1 | 0 | 1 | 0 | 0 | 1 | 0 | 1 | 1 | 0 | 1 | 0 | 0 | 1 | 0 | 1 |
| 22 | 0 | 0 | 1 | 1 | 1 | 1 | 0 | 0 | 0 | 0 | 1 | 1 | 1 | 1 | 0 | 0 | 1 | 1 | 0 | 0 | 0 | 0 | 1 | 1 | 1 | 1 | 0 | 0 | 0 | 0 | 1 | 1 |
| 23 | 0 | 1 | 1 | 0 | 1 | 0 | 0 | 1 | 0 | 1 | 1 | 0 | 1 | 0 | 0 | 1 | 1 | 0 | 0 | 1 | 0 | 1 | 1 | 0 | 1 | 0 | 0 | 1 | 0 | 1 | 1 | 0 |
| 24 | 0 | 0 | 0 | 0 | 0 | 0 | 0 | 0 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 |
| 25 | 0 | 1 | 0 | 1 | 0 | 1 | 0 | 1 | 1 | 0 | 1 | 0 | 1 | 0 | 1 | 0 | 1 | 0 | 1 | 0 | 1 | 0 | 1 | 0 | 0 | 1 | 0 | 1 | 0 | 1 | 0 | 1 |
| 26 | 0 | 0 | 1 | 1 | 0 | 0 | 1 | 1 | 1 | 1 | 0 | 0 | 1 | 1 | 0 | 0 | 1 | 1 | 0 | 0 | 1 | 1 | 0 | 0 | 0 | 0 | 1 | 1 | 0 | 0 | 1 | 1 |
| 27 | 0 | 1 | 1 | 0 | 0 | 1 | 1 | 0 | 1 | 0 | 0 | 1 | 1 | 0 | 0 | 1 | 1 | 0 | 0 | 1 | 1 | 0 | 0 | 1 | 0 | 1 | 1 | 0 | 0 | 1 | 1 | 0 |
| 28 | 0 | 0 | 0 | 0 | 1 | 1 | 1 | 1 | 1 | 1 | 1 | 1 | 0 | 0 | 0 | 0 | 1 | 1 | 1 | 1 | 0 | 0 | 0 | 0 | 0 | 0 | 0 | 0 | 1 | 1 | 1 | 1 |
| 29 | 0 | 1 | 0 | 1 | 1 | 0 | 1 | 0 | 1 | 0 | 1 | 0 | 0 | 1 | 0 | 1 | 1 | 0 | 1 | 0 | 0 | 1 | 0 | 1 | 0 | 1 | 0 | 1 | 1 | 0 | 1 | 0 |
| 30 | 0 | 0 | 1 | 1 | 1 | 1 | 0 | 0 | 1 | 1 | 0 | 0 | 0 | 0 | 1 | 1 | 1 | 1 | 0 | 0 | 0 | 0 | 1 | 1 | 0 | 0 | 1 | 1 | 1 | 1 | 0 | 0 |
| 31 | 0 | 1 | 1 | 0 | 1 | 0 | 0 | 1 | 1 | 0 | 0 | 1 | 0 | 1 | 1 | 0 | 1 | 0 | 0 | 1 | 0 | 1 | 1 | 0 | 0 | 1 | 1 | 0 | 1 | 0 | 0 | 1 |

FIG. 7B

| | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 |
|---|---|---|---|---|---|---|---|---|---|---|---|---|---|---|---|---|---|---|---|---|---|---|---|---|---|---|---|---|---|---|---|---|
| 0 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 | 1 |
| 1 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 | 1 | 0 |
| 2 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 |
| 3 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 | 1 | 0 | 0 | 1 |
| 4 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 |
| 5 | 1 | 0 | 1 | 0 | 0 | 1 | 0 | 1 | 1 | 0 | 1 | 0 | 0 | 1 | 0 | 1 | 1 | 0 | 1 | 0 | 0 | 1 | 0 | 1 | 1 | 0 | 1 | 0 | 0 | 1 | 0 | 1 |
| 6 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 | 1 | 1 | 0 | 0 | 0 | 0 | 1 | 1 |
| 7 | 1 | 0 | 0 | 1 | 0 | 1 | 1 | 0 | 1 | 0 | 0 | 1 | 0 | 1 | 1 | 0 | 1 | 0 | 0 | 1 | 0 | 1 | 1 | 0 | 1 | 0 | 0 | 1 | 0 | 1 | 1 | 0 |
| 8 | 1 | 1 | 1 | 1 | 1 | 1 | 1 | 1 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 |
| 9 | 1 | 0 | 1 | 0 | 1 | 0 | 1 | 0 | 0 | 1 | 0 | 1 | 0 | 1 | 0 | 1 | 1 | 0 | 1 | 0 | 1 | 0 | 1 | 0 | 0 | 1 | 0 | 1 | 0 | 1 | 0 | 1 |
| 10 | 1 | 1 | 0 | 0 | 1 | 1 | 0 | 0 | 0 | 0 | 1 | 1 | 0 | 0 | 1 | 1 | 1 | 1 | 0 | 0 | 1 | 1 | 0 | 0 | 0 | 0 | 1 | 1 | 0 | 0 | 1 | 1 |
| 11 | 1 | 0 | 0 | 1 | 1 | 0 | 0 | 1 | 0 | 1 | 1 | 0 | 0 | 1 | 1 | 0 | 1 | 0 | 0 | 1 | 1 | 0 | 0 | 1 | 0 | 1 | 1 | 0 | 0 | 1 | 1 | 0 |
| 12 | 1 | 1 | 1 | 1 | 0 | 0 | 0 | 0 | 0 | 0 | 0 | 0 | 1 | 1 | 1 | 1 | 1 | 1 | 1 | 1 | 0 | 0 | 0 | 0 | 0 | 0 | 0 | 0 | 1 | 1 | 1 | 1 |
| 13 | 1 | 0 | 1 | 0 | 0 | 1 | 0 | 1 | 0 | 1 | 0 | 1 | 1 | 0 | 1 | 0 | 1 | 0 | 1 | 0 | 0 | 1 | 0 | 1 | 0 | 1 | 0 | 1 | 1 | 0 | 1 | 0 |
| 14 | 1 | 1 | 0 | 0 | 0 | 0 | 1 | 1 | 0 | 0 | 1 | 1 | 1 | 1 | 0 | 0 | 1 | 1 | 0 | 0 | 0 | 0 | 1 | 1 | 0 | 0 | 1 | 1 | 1 | 1 | 0 | 0 |
| 15 | 1 | 0 | 0 | 1 | 0 | 1 | 1 | 0 | 0 | 1 | 1 | 0 | 1 | 0 | 0 | 1 | 1 | 0 | 0 | 1 | 0 | 1 | 1 | 0 | 0 | 1 | 1 | 0 | 1 | 0 | 0 | 1 |
| 16 | 1 | 1 | 1 | 1 | 1 | 1 | 1 | 1 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 |
| 17 | 1 | 0 | 1 | 0 | 1 | 0 | 1 | 0 | 1 | 0 | 1 | 0 | 1 | 0 | 1 | 0 | 0 | 1 | 0 | 1 | 0 | 1 | 0 | 1 | 0 | 1 | 0 | 1 | 0 | 1 | 0 | 1 |
| 18 | 1 | 1 | 0 | 0 | 1 | 1 | 0 | 0 | 1 | 1 | 0 | 0 | 1 | 1 | 0 | 0 | 0 | 0 | 1 | 1 | 0 | 0 | 1 | 1 | 0 | 0 | 1 | 1 | 0 | 0 | 1 | 1 |
| 19 | 1 | 0 | 0 | 1 | 1 | 0 | 0 | 1 | 1 | 0 | 0 | 1 | 1 | 0 | 0 | 1 | 0 | 1 | 1 | 0 | 0 | 1 | 1 | 0 | 0 | 1 | 1 | 0 | 0 | 1 | 1 | 0 |
| 20 | 1 | 1 | 1 | 1 | 0 | 0 | 0 | 0 | 1 | 1 | 1 | 1 | 0 | 0 | 0 | 0 | 0 | 0 | 0 | 0 | 1 | 1 | 1 | 1 | 0 | 0 | 0 | 0 | 1 | 1 | 1 | 1 |
| 21 | 1 | 0 | 1 | 0 | 0 | 1 | 0 | 1 | 1 | 0 | 1 | 0 | 0 | 1 | 0 | 1 | 0 | 1 | 0 | 1 | 1 | 0 | 1 | 0 | 0 | 1 | 0 | 1 | 1 | 0 | 1 | 0 |
| 22 | 1 | 1 | 0 | 0 | 0 | 0 | 1 | 1 | 1 | 1 | 0 | 0 | 0 | 0 | 1 | 1 | 0 | 0 | 1 | 1 | 1 | 1 | 0 | 0 | 0 | 0 | 1 | 1 | 1 | 1 | 0 | 0 |
| 23 | 1 | 0 | 0 | 1 | 0 | 1 | 1 | 0 | 1 | 0 | 0 | 1 | 0 | 1 | 1 | 0 | 0 | 1 | 1 | 0 | 1 | 0 | 0 | 1 | 0 | 1 | 1 | 0 | 1 | 0 | 0 | 1 |
| 24 | 1 | 1 | 1 | 1 | 1 | 1 | 1 | 1 | 0 | 0 | 0 | 0 | 0 | 0 | 0 | 0 | 0 | 0 | 0 | 0 | 0 | 0 | 0 | 0 | 1 | 1 | 1 | 1 | 1 | 1 | 1 | 1 |
| 25 | 1 | 0 | 1 | 0 | 1 | 0 | 1 | 0 | 0 | 1 | 0 | 1 | 0 | 1 | 0 | 1 | 0 | 1 | 0 | 1 | 0 | 1 | 0 | 1 | 1 | 0 | 1 | 0 | 1 | 0 | 1 | 0 |
| 26 | 1 | 1 | 0 | 0 | 1 | 1 | 0 | 0 | 0 | 0 | 1 | 1 | 0 | 0 | 1 | 1 | 0 | 0 | 1 | 1 | 0 | 0 | 1 | 1 | 1 | 1 | 0 | 0 | 1 | 1 | 0 | 0 |
| 27 | 1 | 0 | 0 | 1 | 1 | 0 | 0 | 1 | 0 | 1 | 1 | 0 | 0 | 1 | 1 | 0 | 0 | 1 | 1 | 0 | 0 | 1 | 1 | 0 | 1 | 0 | 0 | 1 | 1 | 0 | 0 | 1 |
| 28 | 1 | 1 | 1 | 1 | 0 | 0 | 0 | 0 | 0 | 0 | 0 | 0 | 1 | 1 | 1 | 1 | 0 | 0 | 0 | 0 | 1 | 1 | 1 | 1 | 1 | 1 | 1 | 1 | 0 | 0 | 0 | 0 |
| 29 | 1 | 0 | 1 | 0 | 0 | 1 | 0 | 1 | 0 | 1 | 0 | 1 | 1 | 0 | 1 | 0 | 0 | 1 | 0 | 1 | 1 | 0 | 1 | 0 | 1 | 0 | 1 | 0 | 0 | 1 | 0 | 1 |
| 30 | 1 | 1 | 0 | 0 | 0 | 0 | 1 | 1 | 0 | 0 | 1 | 1 | 1 | 1 | 0 | 0 | 0 | 0 | 1 | 1 | 1 | 1 | 0 | 0 | 1 | 1 | 0 | 0 | 0 | 0 | 1 | 1 |
| 31 | 1 | 0 | 0 | 1 | 0 | 1 | 1 | 0 | 0 | 1 | 1 | 0 | 1 | 0 | 0 | 1 | 0 | 1 | 1 | 0 | 1 | 0 | 0 | 1 | 1 | 0 | 0 | 1 | 0 | 1 | 1 | 0 |

DIGITAL BROADCASTING TRANSMISSION APPARATUS AND INSERTING METHOD OF INFORMATION FOR RECEIVER DEMODULATION THEREOF

CROSS-REFERENCE TO RELATED APPLICATIONS

This application claims the benefit of U.S. Provisional Application No. 60/788,729 filed Apr. 4, 2006, in the United States Patents and Trademark Office, and Korean Patent Application No. 2006-59505 filed Jun. 29, 2006, in the Korean Intellectual Property Office, the disclosure of which is incorporated herein by reference.

BACKGROUND OF THE INVENTION

1. Field of the Invention

Aspects of the present invention relate to a digital broadcasting transmission apparatus which inserts information for receiver demodulation in a transmission signal, and an inserting method thereof, and more particularly, to a digital broadcasting transmission apparatus which enables a receiver to obtain precise information for demodulation and to provide an improved reception performance, and an inserting method thereof.

2. Description of the Related Art

Figure 1:
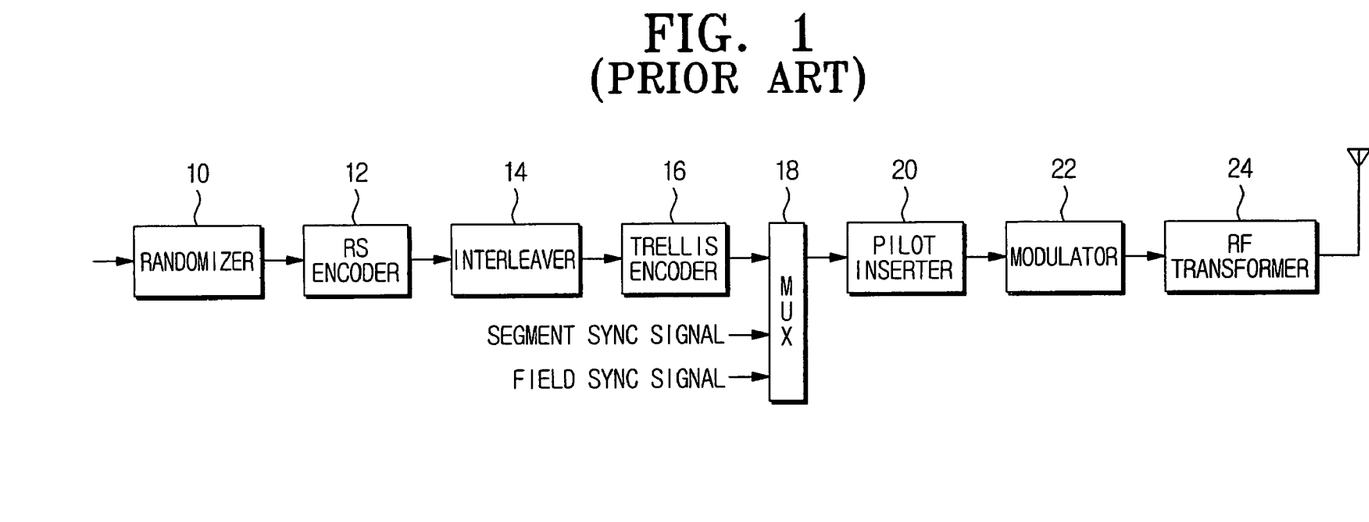
FIG. 1 is a block diagram of a general digital broadcasting transmission apparatus.
Figure 2:
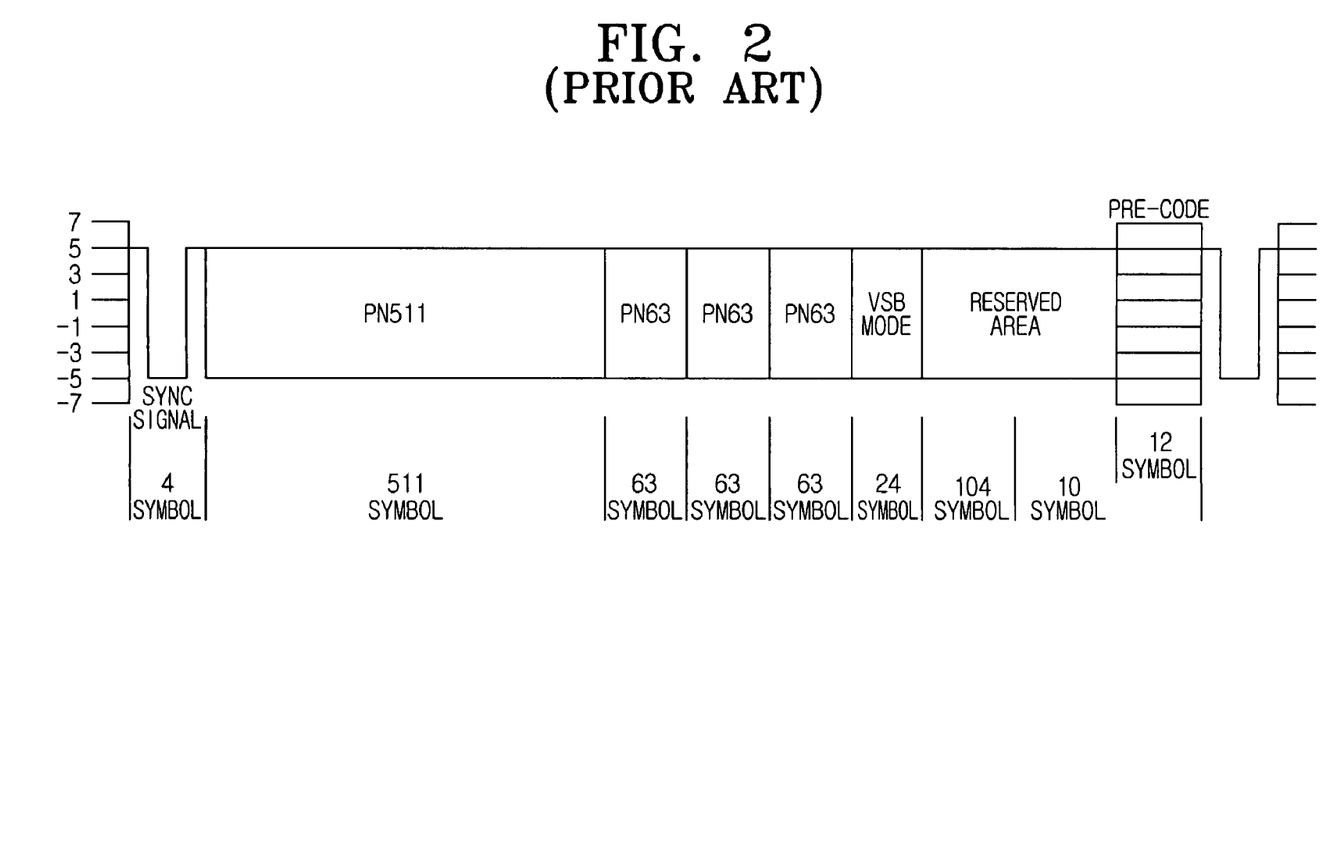
FIG. 2 is a view illustrating a general field sync signal.

FIG. 1 is a block diagram of a general digital broadcasting transmission apparatus, and FIG. 2 is a view illustrating a general field sync signal.

The general digital broadcasting transmission apparatus shown in FIG. 1 is an existing standard 8-level vestigial sideband (VSB) transmission apparatus and includes a randomizer 10, a Reed-Solomon (RS) encoder 12, an interleaver 14, a trellis encoder 16, a multiplexer 18, a pilot inserter 20, a modulator 22, and a radio frequency (RF) transformer 24.

A transmission process of the general digital broadcasting transmission apparatus having the above-described structure will now be described briefly. The randomizer 10 randomizes a transport stream (TS). The RS encoder 12 adds parity bits to the TS to correct an error. The interleaver 14 interleaves the TS, and the trellis encoder 16 trellis encodes the interleaved TS.

The multiplexer 18 inserts a field sync signal and a segment sync signal into the TS having undergone error correction encoding to multiplex the TS. The pilot inserter 20 inserts a pilot signal into the TS, the modulator 22 performs VSB modulation on the TS, and the RF transformer 24 transforms the modulated signal into an RF signal, amplifies the RF signal, and transmits the RF signal through a channel assigned a predetermined band.

As shown in FIG. 1, the multiplexer 18 of the general digital broadcasting transmission apparatus inserts the field sync signal and the segment sync signal into the TS to perform multiplexing. Here, the field sync signal and the segment sync signal are used by a reception apparatus to perform synchronization and equalization and compares data that are well known between the general digital broadcasting transmission apparatus and the reception apparatus. The field sync signal is shown in FIG. 2.

The field sync signal is regularly repeated at an interval of 24.2 ms and includes one complete segment starting from the segment sync signal. Each symbol is expressed with 2 levels, and the field sync signal includes 832 symbols.

As shown in FIG. 2, the field sync signal having 832 symbols includes four segment sync signal symbols, a PN 511, three PN63 pseudo random sequences, a VSB mode, and a reserved area.

Here, the last 12 symbols of the reserved area are in a pre-code area reserved to transmit the last 12 symbols of a previous field, and 10 symbols of a front end of the pre-code area are in an extension segment area providing information about a turbo coding used in the transmission apparatus. Generally, approximately 82 symbols of 104 symbols of the reserved area except for the last 12 symbols of the pre-code area and the 10 symbols of the extension segment area may be used to provide information about a technology used by the transmission apparatus to improve a reception performance with the approval of the Advanced Television Systems Committee (ATSC).

It is important that the transmission apparatus safely transmits information about a technology used in the transmission apparatus to improve reception performance so that the receiver can provide a good reception performance as intended by the transmission apparatus.

Therefore, a method is required, which inserts information about a technology used in the transmission apparatus to improve a reception performance into segment sync signals and field sync signals used as reference signals during the performance of equalization in the receiver so that the receiver can readily utilize the received information.

SUMMARY OF THE INVENTION

Additional aspects and/or advantages of the invention will be set forth in part in the description which follows and, in part, will be obvious from the description, or may be learned by practice of the invention.

Accordingly, aspects of the present invention have been made to solve the above-mentioned and/or other problems, and an aspect of the present general invention is to provide a digital broadcasting transmission apparatus for inserting information for receiver demodulation into a reserved area of a field sync signal so that a receiver can obtain precise information for demodulation and thus provide improved reception performance, and a method thereof.

According to an aspect of the present invention, there is provided a digital broadcasting transmission apparatus including: a turbo coder performing turbo coding on a transport stream (TS); a field sync signal generator inserting information for receiver demodulation into a reserved area of a field sync signal; and a multiplexer adding the field sync signal into which the information for receiver demodulation has been inserted and a segment sync signal to the turbo coded TS to form a data frame.

The information for receiver demodulation may include information as to an SRS (supplementary reference sequence) byte length, information as to a transmission data rate of a turbo stream, information as to a number of turbo streams, or information as to an encoding rate of the turbo stream.

The digital broadcasting transmission apparatus may further include a controller generating first and second control signals based on the information for receiver demodulation input from the turbo coder, wherein the first control signal controls the turbo coder and the second control signal controls the field sync signal generator. The turbo coder may perform the turbo coding according to the first control signal. The field sync signal generator may insert the information for receiver demodulation into the reserved area of the field sync signal according to the second control signal.

The field sync signal generator may insert the information for receiver demodulation into the reserved area of the field sync signal using at least one Walsh code.

The field sync signal generator may divide the reserved area of the field sync signal into an area for inserting information for receiver demodulation and a residual reserved area and insert the information for receiver demodulation into the area for inserting information for receiver demodulation.

The field sync signal generator may sub-divide the area for inserting information for receiver demodulation into a plurality of areas and insert the information for receiver demodulation into each of the plurality of areas according to each respective type of the information for receiver demodulation.

According to another aspect of the present invention, there is provided A method of inserting information for receiver demodulation in a digital broadcasting transmission apparatus, including: performing turbo coding on a transport stream (TS); inserting information for receiver demodulation into a reserved area of a field sync signal; and adding the field sync signal into which the information for receiver demodulation has been inserted and a segment sync signal to the turbo coded TS to form a data frame.

The information for receiver demodulation may include information as to an SRS byte length, information as to a transmission data rate of a turbo stream, information as to a number of turbo streams, or information as to an encoding rate of the turbo stream.

The method of inserting information for receiver demodulation may further include generating first and second control signals based on the information for receiver demodulation to respectively control the performing of the turbo coding and inserting of the predetermined coding information into the reserved area of the field sync signal. The turbo coding may be performed according to the first control signal. The information for receiver demodulation may be inserted into the reserved area of the field sync signal according to the second control signal.

The information for receiver demodulation may be inserted into the reserved area of the field sync signal using Walsh codes.

The inserting of the information for receiver demodulation into the reserved area of the field sync signal may include: dividing the reserved area of the field sync signal into an area for inserting information for receiver demodulation and a residual reserved area; and inserting the information for receiver demodulation into the area for inserting information for receiver demodulation.

The area for inserting information for receiver demodulation may be sub-divided into a plurality of areas, and the information for receiver demodulation may be inserted into each of the plurality of areas according to each respective type of the information for receiver demodulation.

BRIEF DESCRIPTION OF THE DRAWINGS

These and/or other aspects and advantages of the invention will become apparent and more readily appreciated from the following description of the embodiments, taken in conjunction with the accompanying drawings of which.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

Figure 3:
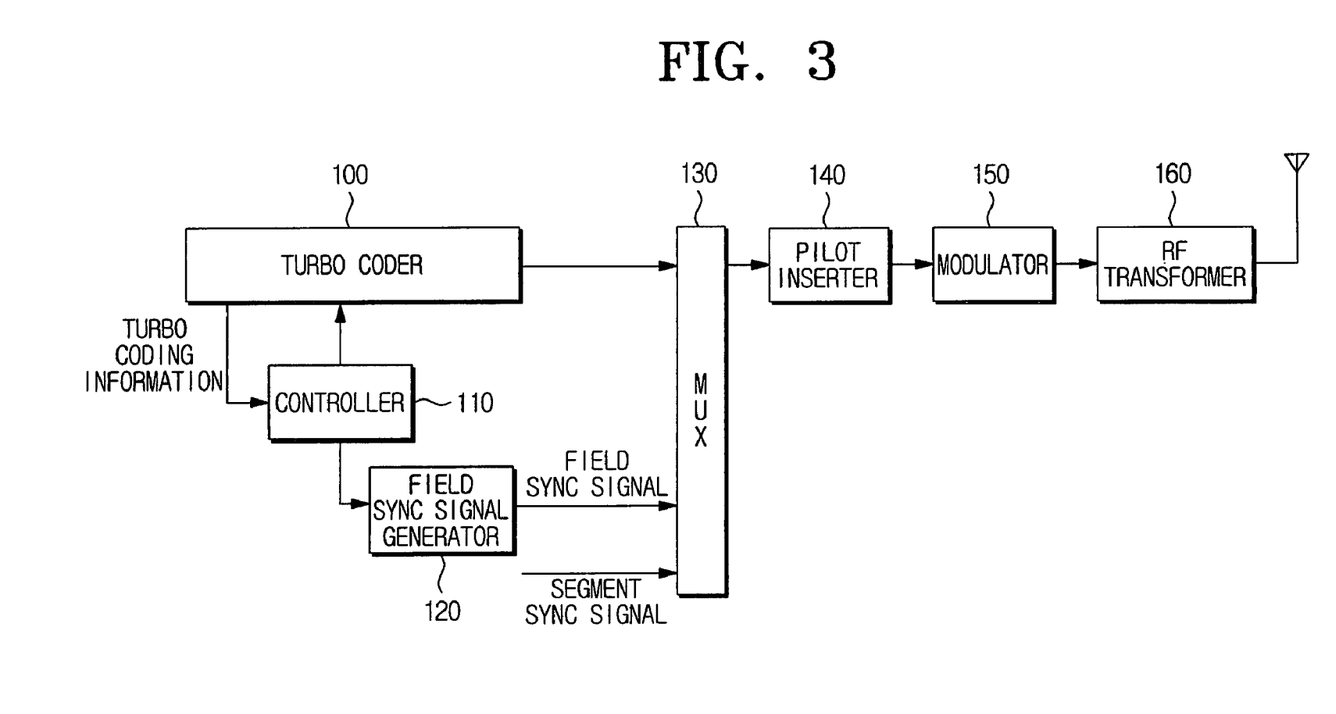
FIG. 3 is a block diagram of a digital broadcasting transmission apparatus according to an embodiment of the present invention.

FIG. 3 is a block diagram of a digital broadcasting transmission apparatus according to an embodiment of the present invention. Referring to FIG. 3, the digital broadcasting transmission apparatus includes a turbo coder 100, a controller 110, a field sync signal generator 120, a multiplexer 130, a pilot inserter 140, a modulator 150, and an RF transformer 160.

The turbo coder 100 performs turbo coding on a TS. The TS applied to the present embodiment may be a dual TS generated by adding robust (turbo) data to normal data of an existing ATSC VSB system.

The turbo coding performed by the turbo coder 100 includes error control coding and refers to a type of technology additionally performed in a standard 8-VSB as reception performance improving technology.

The turbo coder 100 performs a series of processes including randomizing and trellis encoding of the TS. The series of processes may vary substantially according to the particular turbo coding method used in the turbo coder 100. The turbo coder 100 will be described in more detail with reference to FIG. 4.

The controller 110 generates predetermined control signals to control the turbo coder 100 and the field sync signal generator 120. The controller 110 may generate first and second control signals and control the turbo coder 100 according to the first control signal to perform the turbo coding and the field sync signal generator 120 according to the second control signal to generate a field sync signal.

The controller 110 receives predetermined (turbo coding) information for receiver demodulation from the turbo coder 100 and generates the first and second control signals based on the information for receiver demodulation. Here, the information for receiver demodulation includes at least one of information as to a supplementary reference sequence (SRS) byte length, information as to a transmission data rate of a turbo stream, information as to a number of turbo streams, and an encoding rate of a turbo stream. In other words, the turbo coding information includes information as to a supplementary reference sequence (SRS) byte length, information as to a data transmission rate of a turbo stream, information as to a number of turbo streams, and an encoding rate of a turbo stream, or any combination thereof.

The field sync signal generator 120 inserts the information for receiver demodulation into a reserved area of the field sync signal. The insertion of the information for receiver demodulation into the field sync signal by the field sync signal generator 120 can result in an easy acquisition of information so as to enable reception performance improving technology in a reception apparatus.

The field sync signal includes a total of 832 symbols as shown in FIG. 2 and four segment sync signal symbols, a PN511, three PN63 pseudo random sequences, a VSB mode, and the reserved area.

The field sync signal generator 120 inserts the information for receiver demodulation into the reserved area of the field sync signal according to the second control signal generated by the controller 110. The field sync signal generator 120 may insert the information for receiver demodulation into the reserved area of the field sync signal using Walsh codes.

The field sync signal generator 120 may also divide the reserved area of the field sync signal into an area for inserting information for receiver demodulation and a residual reserved area. Here, the area for inserting information for receiver demodulation is an area allocated to the insertion of the information for receiver demodulation, and the residual reserved area is a remaining area except for the area allocated as the area for inserting information for receiver demodulation in the reserved area of the existing field sync signal shown in FIG. 2.

The field sync signal generator 120 may also sub-divide the area for inserting information for receiver demodulation into a plurality of areas and insert the information for receiver demodulation into the plurality of areas according to the type of the turbo coding formation.

The field sync signal generator 120 may sub-divide the area for inserting information for receiver demodulation into one or more areas having an appropriate size according to a size of information for receiver demodulation to be inserted and Walsh codes to be used. This will be described in more detail with reference to FIGS. 5A through 5F.

The multiplexer 130 adds the field sync signal and a segment sync signal to the TS turbo coded by the turbo coder 100 to form a data frame. Here, the field sync signal is input from the field sync signal generator 120 and includes the reserved area into which the information for receiver demodulation has been inserted.

The pilot inserter 140 adds a pilot signal to the TS to which the field sync signal and the segment sync signal have been added by the multiplexer 130. Here, the pilot signal appears at a zero frequency point of a spectrum at which a slight direct current (DC) deviation is applied to an 8-VSB base band immediately before modulation and some residual carriers are modulated and functions as synchronizing an RF phase-locked loop (PLL) circuit of the reception apparatus regardless of a transmitted signal.

The modulator 150 pulse shapes the TS to which the pilot inserter 140 has added the pilot signal and performs VSB modulation on the TS together with intermediate frequency carriers to modulate an amplitude of the TS.

The RF transformer 160 RF transforms the TS VSB modulated by the modulator 150, amplifies the TS, and transmits the TS through a channel allocated to a predetermined band.

Figure 4:
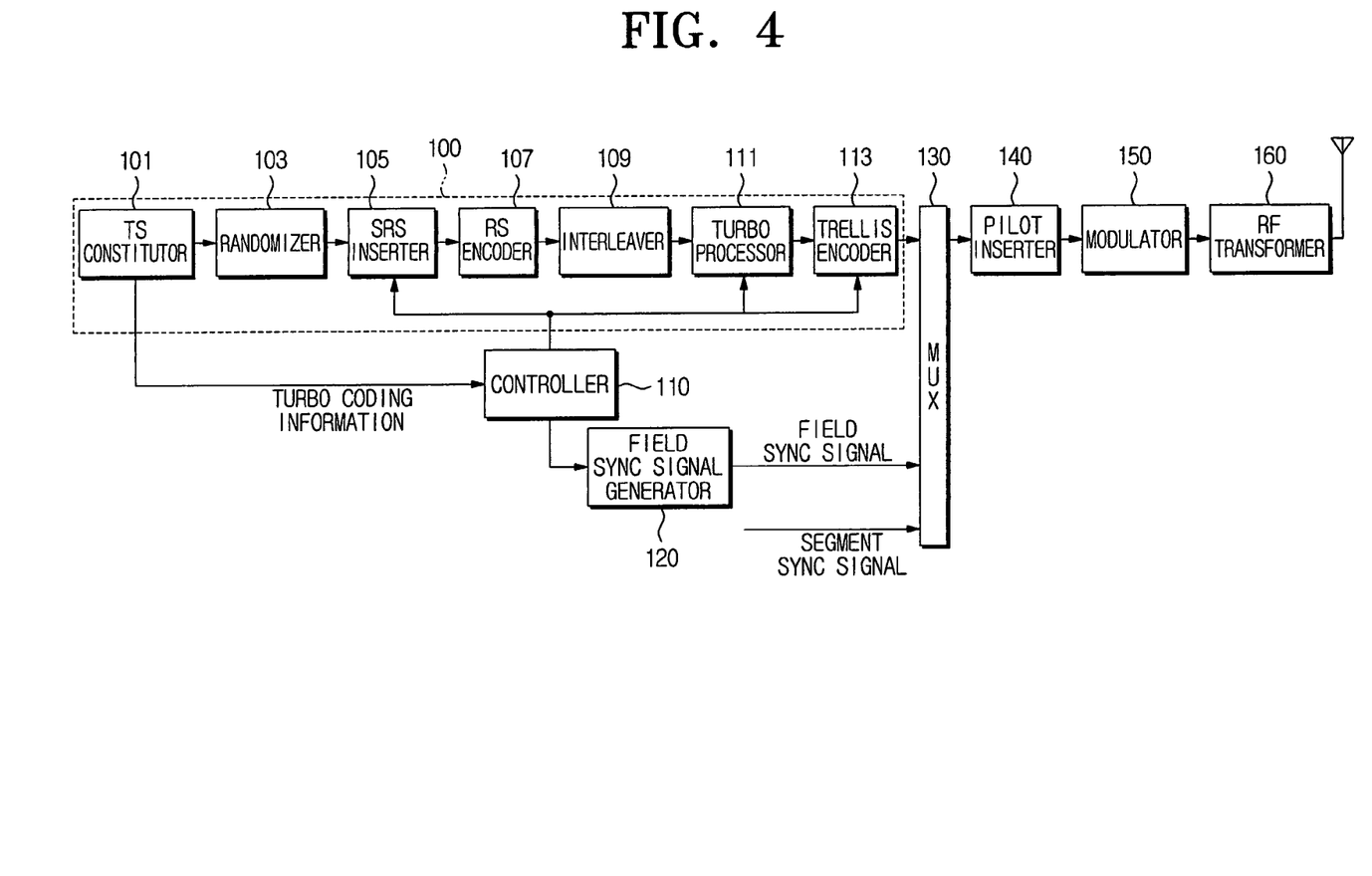
FIG. 4 is a block diagram showing an example where a digital broadcasting transmission apparatus is practically applied.

FIG. 4 is a block diagram showing an example where a digital broadcasting transmission apparatus is practically applied. Here, the digital broadcasting transmission apparatus uses dual TS technology and SRS technology as a turbo coding method.

Referring to FIG. 4, the digital broadcasting transmission apparatus includes a turbo coder 100, the controller 110, the field sync signal generator 120, the multiplexer 130, the pilot inserter 140, the modulator 150, and the RF transformer 160.

The digital broadcasting transmission apparatus of the present embodiment has a similar structure to the digital broadcasting transmission apparatus shown in FIG. 3, and like reference numerals denote like elements. Only elements of the digital broadcasting transmission apparatus of FIG. 4 different from those of the digital broadcasting transmission apparatus shown in FIG. 3 will be described herein.

The turbo coder 100 includes a TS constitutor 101, a randomizer 103, an SRS inserter 105, an RS encoder 107, an interleaver 109, a turbo processor 111, and a trellis encoder 113.

The TS constitutor 101 generates a stuffing region in which an SRS is to be inserted into a normal stream and a turbo stream and multiplexes the normal stream and the turbo stream to constitute a dual TS. The TS constitutor 101 also determines information for receiver demodulation and provides the information for receiver demodulation to the controller 110.

The randomizer 103 randomizes the dual TS constituted by the TS constitutor 101.

The SRS inserter 105 inserts the SRS into the stuffing region of the dual TS randomized by the randomizer 103. Here, the SRS inserter 105 may receive information as to a byte length of the SRS from the controller 110 uses the information during the insertion of the SRS into the stuffing region.

The RS encoder 107 adds parity bits to a parity region of the dual TS having the stuffing region into which the SRS inserter 105 has inserted the SRS. The RS encoder 107 may be a concatenated coder adding parity bits to the TS to correct an error that may occur due to a channel characteristic in a transmission process.

The interleaver 109 interleaves the dual TS to which the parity bits have been added by the RS encoder 107. The interleaver 109 of the present embodiment is positioned between the RS encoder 107 and the turbo processor 111 but may be positioned between the turbo processor 111 and the trellis encoder 113.

The turbo processor 111 passes the normal stream of the dual TS interleaved by the interleaver 109 and codes the turbo stream. Here, the turbo processor 111 may receive the information for receiver demodulation, i.e., the information as to the byte length of the SRS, information as to a transmission data rate of the turbo stream, information as to a number of turbo streams, and an encoding rate of the turbo stream, from the controller 110 and use the information for receiver demodulation during the coding of the turbo stream.

The trellis encoder 113 trellis-encodes the dual TS processed by the turbo processor 111. Here, the trellis encoder 113 may receive the information as to the byte length of the SRS from the controller 110 and use the information during the trellis encoding of the dual TS.

The controller 110, the field sync signal generator 120, the multiplexer 130, the pilot inserter 140, the modulator 150, and the RF transformer 160 have the same functions as the controller 110, the field sync signal generator 120, the multiplexer 130, the pilot inserter 140, the modulator 150, and the RF transformer 160 shown in FIG. 3 and thus will not be described herein.

Figure 6A:
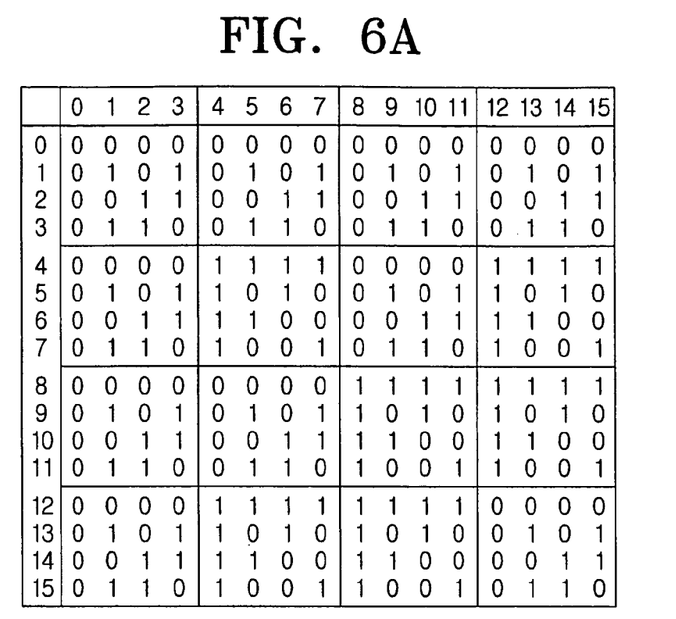
FIGS. 6A and 6B are views illustrating 16 Walsh codes.
Figure 6B:
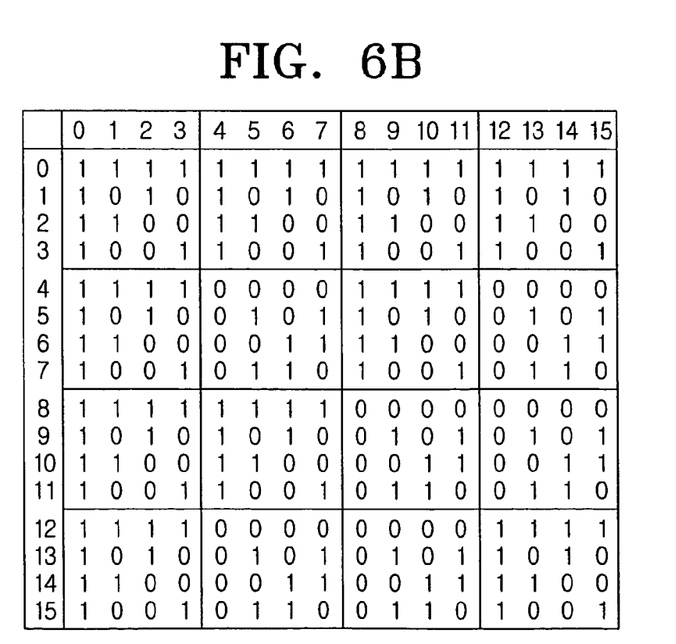
Figure 7A:
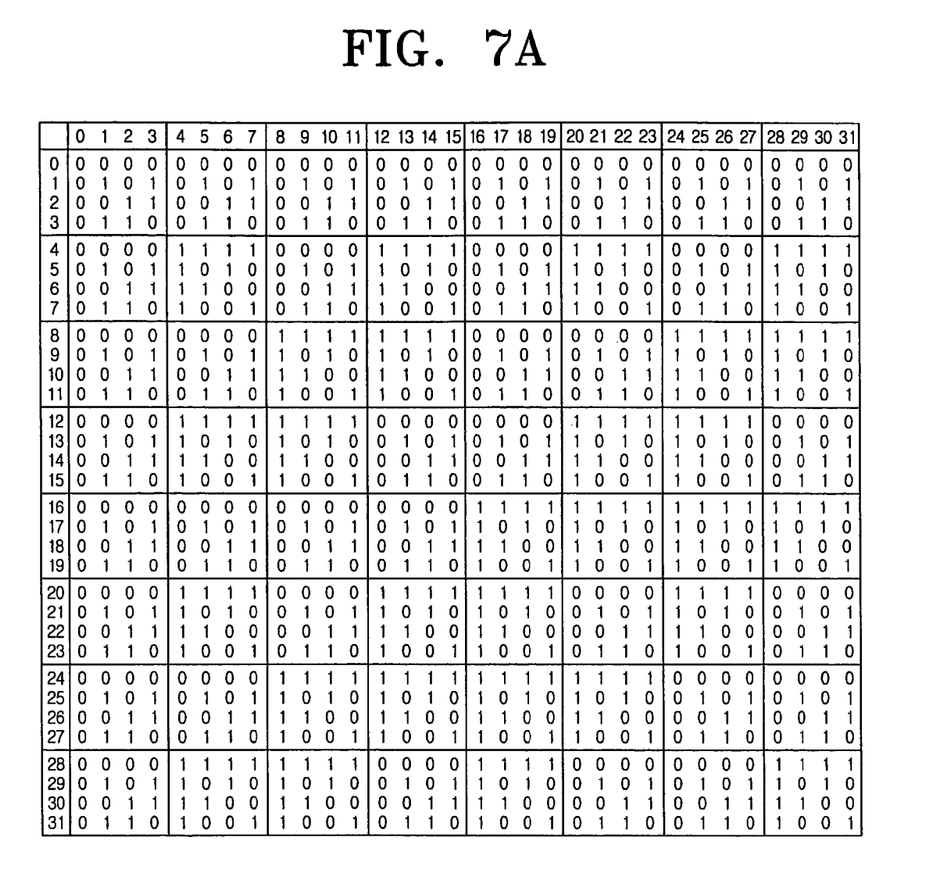
FIGS. 7A and 7B are views illustrating 32 Walsh codes.
Figure 7B:
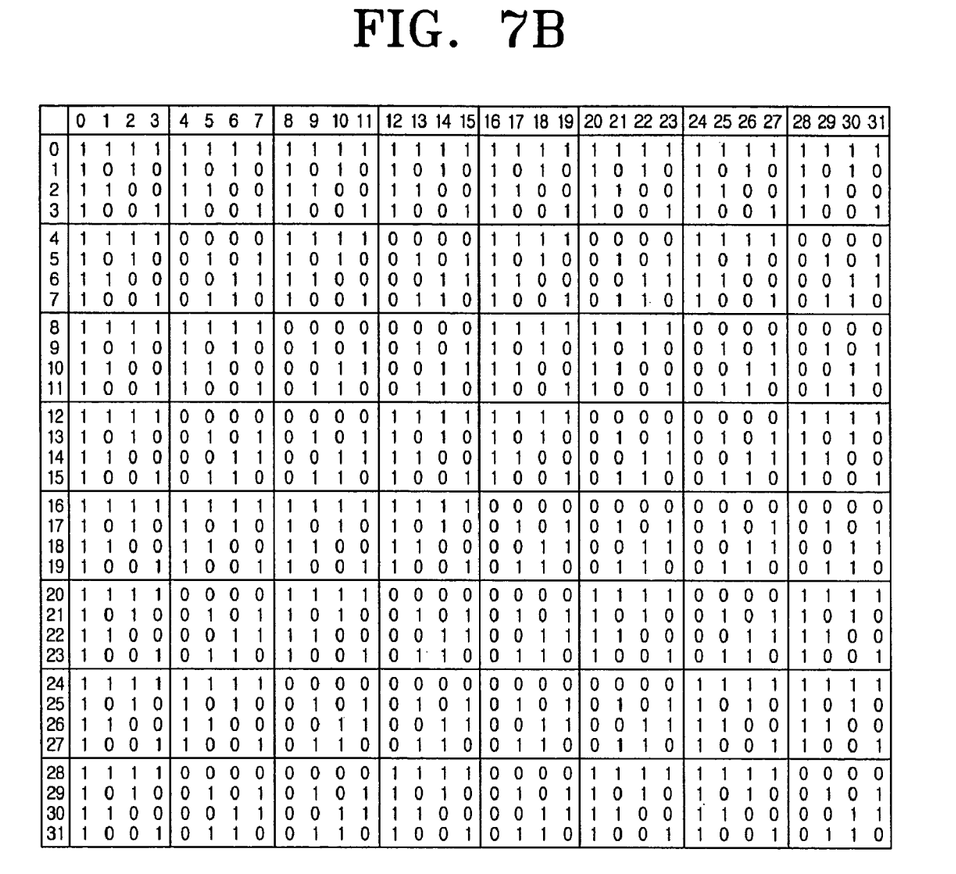
Figure 8A:
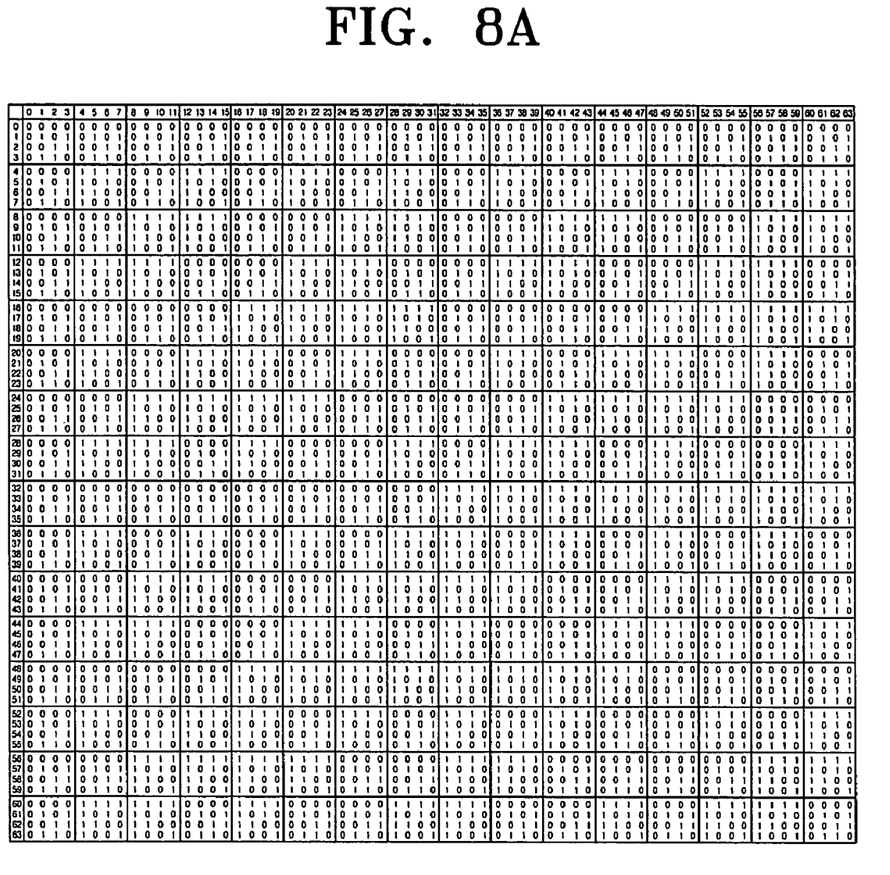
FIGS. 8A and 8B are views illustrating 64 Walsh codes.
Figure 8B:
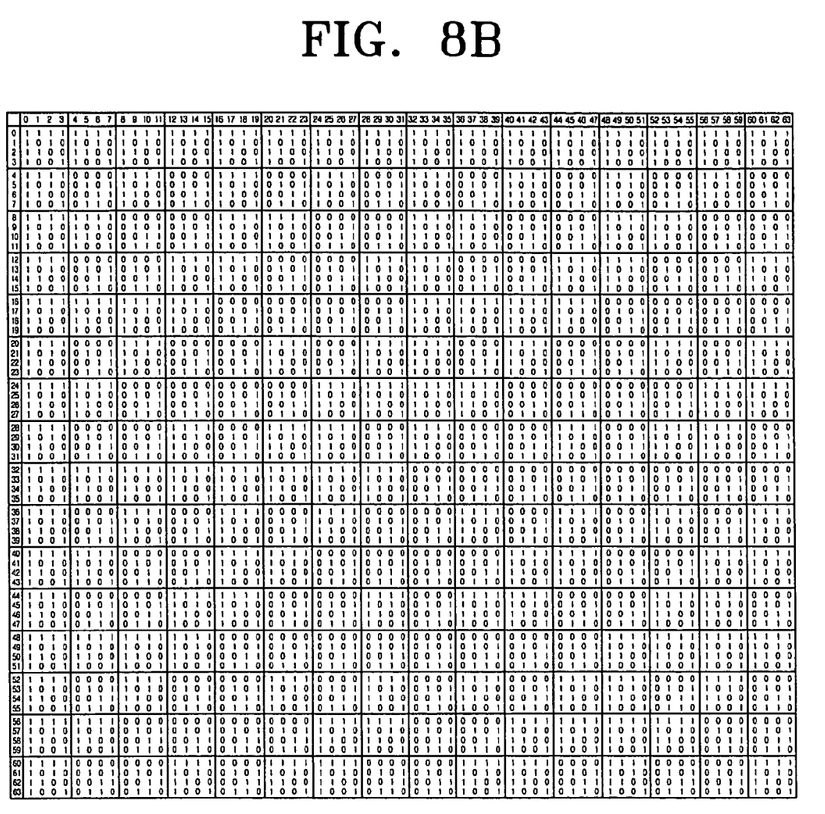

FIGS. 5A through 5F are views illustrating field sync signals according to preferred embodiments of the present invention. FIGS. 6A and 6B are views illustrating 16 Walsh codes, FIGS. 7A and 7B are views illustrating 32 Walsh codes, and FIGS. 8A and 8B are views illustrating 64 Walsh codes.

A field sync signal divided into areas by the field sync signal generator 120 includes an area for inserting information for receiver demodulation, a residual reserved area, an extension segment area, and a pre-code. Here, sizes of the area for inserting information for receiver demodulation and the residual reserved area may be changed, but the extension segment area and the pre-code have fixed sizes, i.e., 10 symbols and 12 symbols, respectively.

The area for inserting information for receiver demodulation is an area into which information for receiver demodulation is to be inserted, and the residual reserved area is a remaining area except for an area allocated as the area for inserting information for receiver demodulations, the extension segment area, and the pre-code, in the reserved area of the field sync signal. The extension segment area is an area in which information as to a type of a used turbo coding method is to be recorded, and the pre-code is an area reserved to transmit the last 12 symbols of a previous field.

Figure 5A:
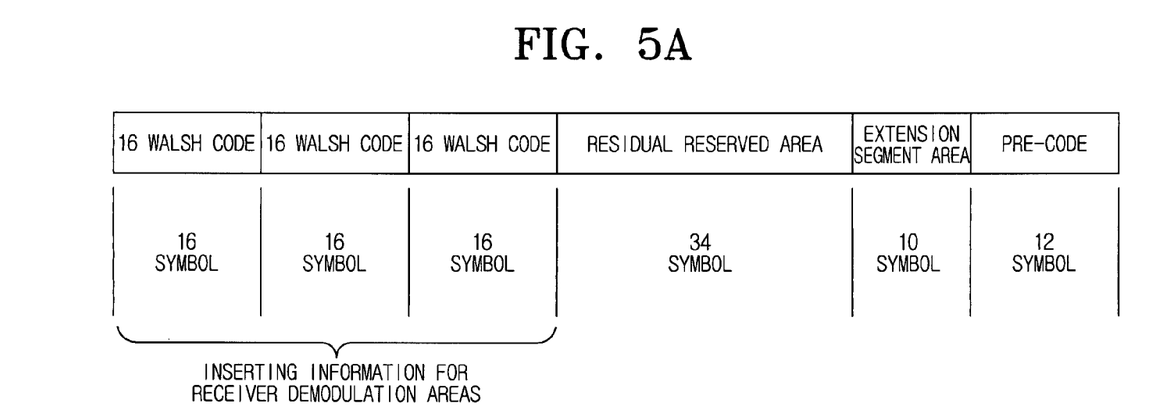
FIGS. 5A through 5F are views illustrating field sync signals according to embodiments of the present invention.

A reserved area of a field sync signal shown in FIG. 5A includes three areas for inserting information for receiver demodulations each having 16 symbols, a residual reserved area having 34 symbols, an extension segment area having 10 symbols, and a pre-code having 12 symbols.

Here, information as to an SRS byte length, information as to a transmission data rate of a turbo stream, information as to a number of turbo streams, and information as to an encoding rate of the turbo stream may be inserted into each of the three areas for inserting information for receiver demodulation using 16 Walsh codes shown in FIG. 6A or 6B.

An order and an allocation method of inserting information for receiver demodulation into the three areas for inserting information for receiver demodulation may appropriately vary with the goals and preferences of a user. Also, all combinations of modes may be allocated to the three areas for inserting information for receiver demodulation according to the convenience of the user. In this case, 4096 mode combinations may be allocated. If additional information for receiver demodulation is to be provided, the three areas for inserting information for receiver demodulation may be extended using a part or the entirety of the residual reserved area having the 34 symbols.

Figure 5B:
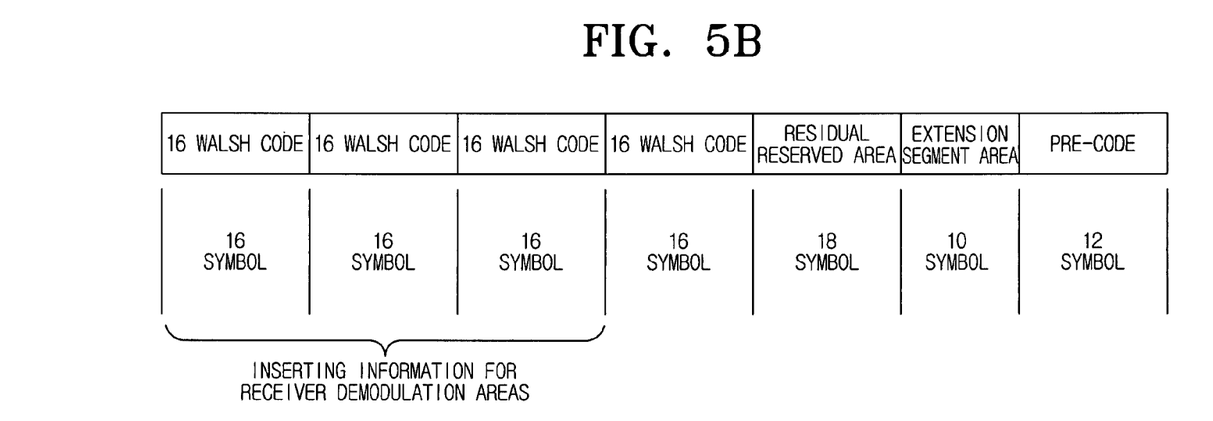

A reserved area of a field sync signal shown in FIG. 5B includes four area for inserting information for receiver demodulation each having 16 symbols, a residual reserved area having 18 symbols, an extension segment area having 10 symbols, and a pre-code having 12 symbols.

A method of allocating information for receiver demodulation to the four areas for inserting information for receiver demodulation or a method of randomly allocating four 16 Walsh code values for all mode combinations by a user may be used. In this case, 65536 information combinations for receiver demodulation may be allocated. If additional information for receiver demodulation is to be provided, the four areas for inserting information for receiver demodulation may be extended using a part or the entirety of the residual reserved area having 18 symbols. Here, the information for receiver demodulation may be inserted into the four areas for inserting information for receiver demodulations using 16 Walsh codes shown in FIG. 6A or 6B.

Figure 5C:
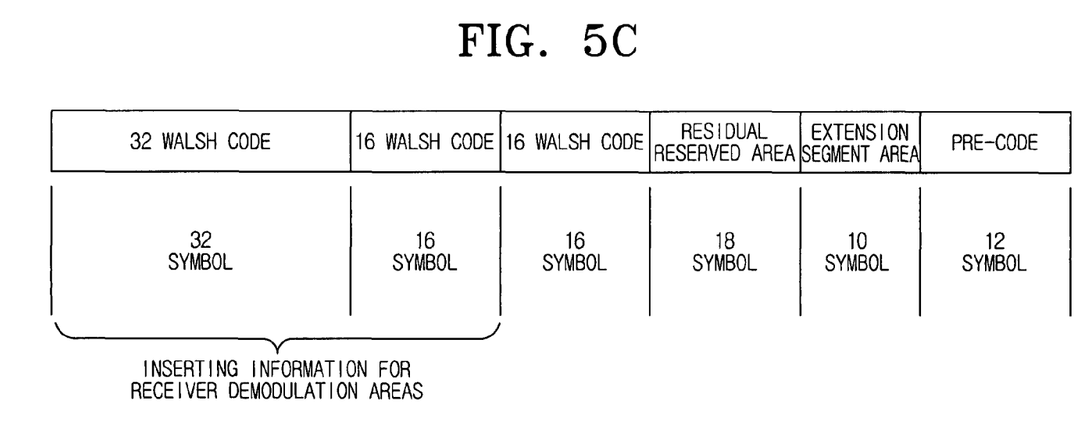

A reserved area of a field sync signal shown in FIG. 5C includes an area for inserting information for receiver demodulation having 32 symbols, two areas for inserting information for receiver demodulation each having 16 symbols, a residual reserved area having 18 symbols, an extension segment area having 10 symbols, and a pre-code having 12 symbols.

The field sync signal shown in FIG. 5C is different from the field sync signal shown in FIG. 5A in that greater Walsh codes are used for more important information of the information for receiver demodulation so that the information for receiver demodulation can have a stronger characteristic in a multi-path channel.

As shown in FIG. 5C, a user may randomly allocate four 16 Walsh code values for all mode combinations. In this case, 8192 16 Walsh codes may be allocated. If additional information for receiver demodulation is to be provided, the area for inserting information for receiver demodulation may be extended using a part or the entirety of the residual reserved area having 18 symbols. Here, the 32 Walsh codes may be the 32 Walsh codes shown in FIG. 7A or 7B.

Figure 5D:
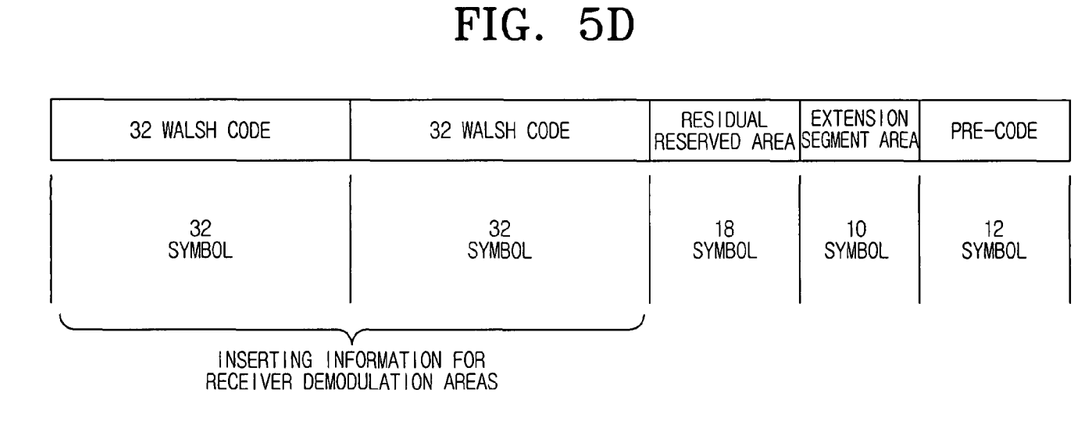

A reserved area of a field sync signal shown in FIG. 5D includes two areas for inserting information for receiver demodulations each having 32 symbols, a residual reserved area having 18 symbols, an extension segment area having 10 symbols, and a pre-code having 12 symbols. Here, the 32 Walsh codes may be the 32 Walsh codes shown in FIG. 7A or 7B.

Figure 5E:
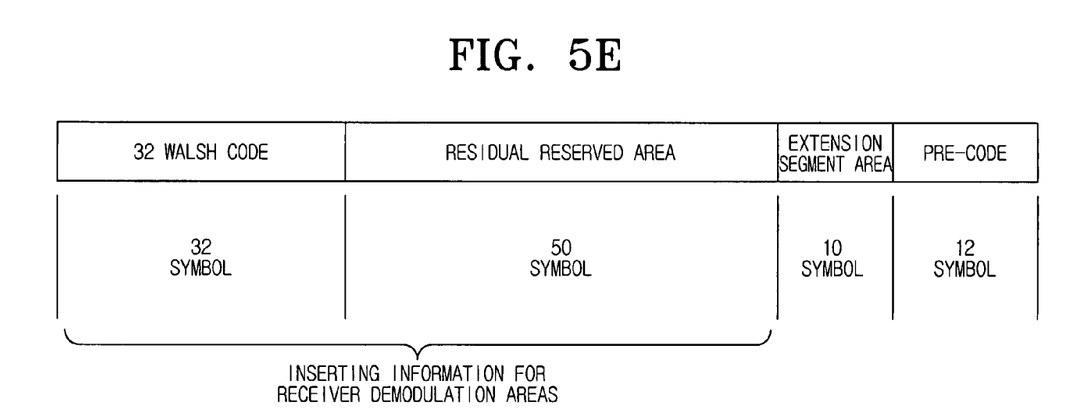

A reserved area of a field sync signal shown in FIG. 5E includes an area for inserting information for receiver demodulation having 32 symbols, a residual reserved area having 50 symbols, an extension segment area having 10 symbols, and a pre-code having 12 symbols. Here, the 32 Walsh codes may be the 32 Walsh codes shown in FIG. 7A or 7B.

Figure 5F:
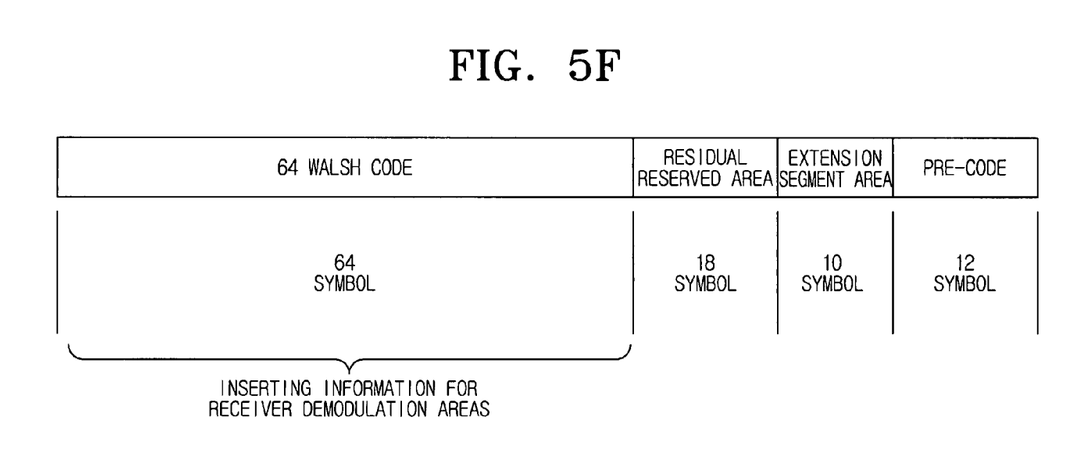

A reserved area of a field sync signal shown in FIG. 5F includes an area for inserting information for receiver demodulation having 64 symbols, a residual reserved area having 18 symbols, an extension segment area having 10 symbols, and a pre-code having 12 symbols. Here, the 64 Walsh codes may be the 64 Walsh codes shown in FIG. 8A or 8B.

As shown in FIG. 5F, a user may randomly allocate one 64 Walsh code values having 64 symbol of all mode combinations. In this case, 64 Walsh codes may be allocated. If additional information for receiver demodulation is to be provided, the area for inserting information for receiver demodulation may be extended using a part or the entirety of the residual reserved area having 18 symbols.

It has been described that information for receiver demodulation is transmitted using Walsh codes. However, a part of the information for receiver demodulation may be transmitted using Walsh codes and the rest of the information for receiver demodulation may be transmitted using another type of codes. A user may appropriately combine sizes or a number of used Walsh codes according to a number of modes and the degree of importance of provided information.

Figure 9:
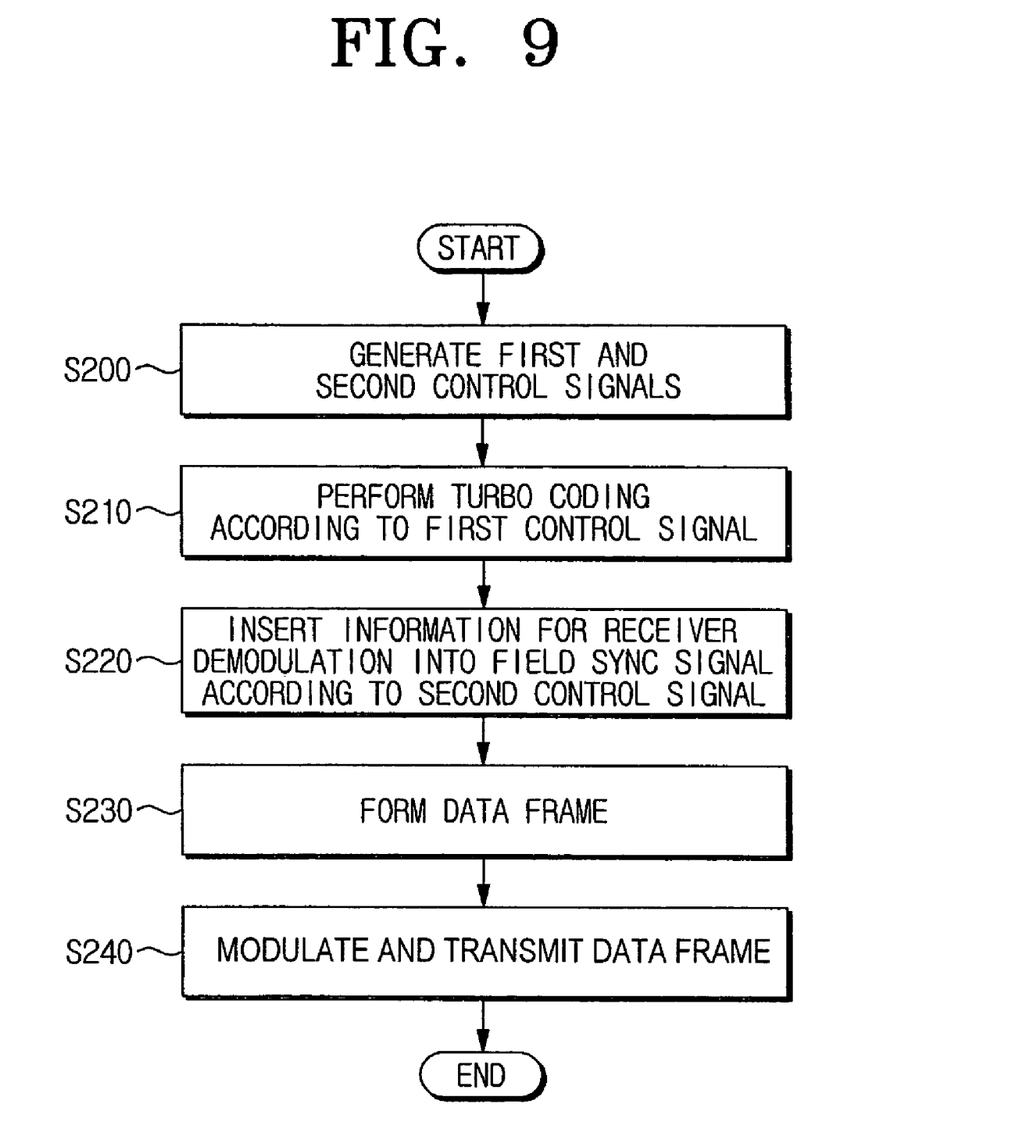
FIG. 9 is a flowchart of a method of inserting information for receiver demodulation in a digital broadcasting transmission apparatus according to an embodiment of the present invention.

FIG. 9 is a flowchart of a method of inserting information for receiver demodulation in a digital broadcasting transmission apparatus according to an embodiment of the present invention.

The method of inserting information for receiver demodulation of the digital broadcasting transmission apparatus will now be described with reference to FIGS. 3 through 9.

In operation S200, the TS constitutor 101 of the turbo coder 100 provides information for receiver demodulation to the controller 110, and the controller 110 generates first and second control signals based on the information for receiver demodulation provided from the TS constitutor 101. The first control signal is used to control the turbo coder 100, and the second control signal is used to control the field sync signal generator 120.

In operation S210, the turbo coder 100 performs turbo coding under the control of the controller 110. In other words, the turbo coder 100 performs randomizing, SRS inserting, RS encoding, interleaving, turbo stream coding, and trellis encoding processes. Here, information for receiver demodulation provided by the controller 110 is used in the SRS inserting, turbo stream coding, and trellis encoding processes.

In operation S220, the field sync signal generator 120 inserts the information for receiver demodulation into a reserved area of a field sync signal under the control of the controller 110, i.e., according to the second control signal. Here, the controller 110 provides different kinds of information for receiver demodulation to the field sync signal generator 120.

If the turbo coder 100 completely turbo codes a TS, the multiplexer 130 adds a field sync signal into which the information for receiver demodulation has been inserted by the field sync signal generator 120 and a segment sync signal to the turbo coded TS to form a data frame in operation S230.

In operation S240, the pilot inserter 140 inserts a pilot signal into the data frame formed by the multiplexer 140, the modulator 150 VSB modulates the data frame, and RF transformer 160 RF transforms the data frame and transmits the RF transformed data frame through a predetermined channel.

A reception apparatus can accurately acquire information as to reception performance improving technology used by a transmission apparatus through the TS transmitted from the transmission apparatus, i.e., information for receiver demodulation, through the above-described process.

As described above, in a digital broadcasting transmission apparatus and an inserting method of information for receiver demodulation thereof according to aspects of the present invention, information for receiver demodulation can be added to a field sync signal having a reserved area. Thus, a reception apparatus can quickly and accurately acquire information as to reception performance improving technology performed by the digital broadcasting transmission apparatus.

Although a few embodiments of the present invention have been shown and described, it would be appreciated by those skilled in the art that changes may be made in this embodiment without departing from -the principles and spirit of the invention, the scope of which is defined in the claims and their equivalents.

What is claimed is:

1. A digital broadcasting transmission apparatus comprising:
    a transmission stream (TS) constitutor to multiplex a supplementary data stream to a normal stream to constitute a transmission stream;
    a trellis encoder to trellis-encode the transmission stream; and
    a multiplexer to multiplex a field sync signal into which predetermined information has been inserted to the trellis encoded transmission stream;
    wherein the predetermined information is to provide data regarding the supplementary data to a digital broadcasting reception apparatus which receives and processes the transmission stream.

2. The digital broadcasting transmission apparatus of claim 1, wherein:
    the supplementary data stream is a turbo stream that is processed to be robust against errors, and
    the predetermined information comprises turbo coding information provided by the TS constitutor.

3. The digital broadcasting transmission apparatus of claim 2, further comprising:
    a field sync signal generator to generate the field sync signal including the turbo coding information and to provide the multiplexer with the generated field sync signal.

4. The digital broadcasting transmission apparatus of claim 1, further comprising:
    a supplementary reference signal (SRS) inserter to insert a supplementary reference signal into the transmission stream.

5. The digital broadcasting transmission apparatus of claim 4, wherein:
    the supplementary data stream is a turbo stream that is processed to be robust against errors, and
    the predetermined information comprises information as to a length of the SRS, information as to a transmission data rate of the turbo stream, information as to a number of turbo streams, and/or information as to an encoding rate of the turbo stream.

6. A stream processing method of a digital transmission apparatus, the method comprising:
    multiplexing a supplementary data stream to a normal stream to constitute a transmission stream;
    a trellis encoder to trellis-encode the transmission stream; and
    a multiplexer to multiplex a field sync signal into which predetermined information has been inserted to the trellis encoded transmission stream;
    wherein the predetermined information is to provide data regarding the supplementary data to a digital broadcasting reception apparatus which receives and processes the transmission stream.

7. The stream processing method of claim 6, wherein:
    the supplementary data stream is a turbo stream that is processed to be robust against errors, and
    the predetermined information comprises turbo coding information regarding a process of the turbo stream.

8. The stream processing method of claim 7, further comprising:
    generating the field sync signal including the turbo coding information.

9. The stream processing method of claim 6, further comprising:
    inserting a supplementary reference signal into the transmission stream.

10. The stream processing method of claim 9, wherein:
    the supplementary data stream is a turbo stream that is processed to be robust against errors, and
    the information comprises information as to a length of the SRS, information as to a transmission data rate of the turbo stream, information as to a number of turbo streams, and/or information as to an encoding rate of the turbo stream.

* * * * *